US009150953B2

(12) United States Patent
Hirakata et al.

(10) Patent No.: US 9,150,953 B2
(45) Date of Patent: Oct. 6, 2015

(54) METHOD FOR MANUFACTURING SEMICONDUCTOR DEVICE INCLUDING ORGANIC SEMICONDUCTOR

(75) Inventors: Yoshiharu Hirakata, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 476 days.

(21) Appl. No.: 11/659,089

(22) PCT Filed: Aug. 5, 2005

(86) PCT No.: PCT/JP2005/014801
§ 371 (c)(1),
(2), (4) Date: Feb. 1, 2007

(87) PCT Pub. No.: WO2006/016669
PCT Pub. Date: Feb. 16, 2006

(65) Prior Publication Data
US 2008/0296560 A1 Dec. 4, 2008

(30) Foreign Application Priority Data
Aug. 13, 2004 (JP) .................. 2004-236156

(51) Int. Cl.
*H01L 51/40* (2006.01)
*C23C 14/22* (2006.01)
(Continued)

(52) U.S. Cl.
CPC .............. *C23C 14/228* (2013.01); *C23C 14/12* (2013.01); *C23C 14/24* (2013.01); *C23C 14/564* (2013.01);
(Continued)

(58) Field of Classification Search
CPC ....... H01L 51/10; H01L 51/40; H01L 51/001; H01L 51/56; H01L 51/0002; H01L 51/0025; H01L 21/324; H01L 51/0037; H01L 51/0052; H01L 51/052; C23C 14/12; C23C 14/243; C23C 14/24; C23C 14/564; C23C 14/228

USPC ........ 438/99, 780; 257/40, E51.006, E51.025
See application file for complete search history.

(56) References Cited

U.S. PATENT DOCUMENTS 4,910,436 A 3/1990 Collins et al.
5,015,330 A * 5/1991 Okumura et al. ............. 438/694
(Continued)

FOREIGN PATENT DOCUMENTS

CN 1428817 7/2003
EP 1 319 732 A1 6/2003
(Continued)

OTHER PUBLICATIONS

Kim, et al., Sid 04, Digest, Sid International Symposium Digest of Technical Papers, "45-2: Self-Organized Organic Thin-Film Transistor for Flexible Active-Matrix Display", pp. 1294-1297, 2004.
(Continued)

Primary Examiner — Duy T Nguyen
(74) Attorney, Agent, or Firm — Nixon Peabody LLP; Jeffrey L. Costellia

(57) ABSTRACT

The present invention provides a method for manufacturing a semiconductor device which can reduce characteristic deterioration due to impurity incorporation. The present invention also provides a semiconductor device and an electric appliance with reduced characteristic deterioration due to the impurity incorporation. The method for manufacturing a semiconductor device has a process for depositing an organic semiconductor. In addition, a process for introducing and exhausting gas having low reactivity while heating a treater so that temperature in the inside of the treater is higher than sublimation temperature of the organic semiconductor after taking a subject deposited with the organic semiconductor from the treater.

19 Claims, 10 Drawing Sheets

(51) Int. Cl.
  *C23C 14/12* (2006.01)
  *C23C 14/24* (2006.01)
  *C23C 14/56* (2006.01)
  *H01L 51/00* (2006.01)
  *H01L 51/05* (2006.01)

(52) U.S. Cl.
  CPC ......... *H01L 51/0002* (2013.01); *H01L 51/052* (2013.01); *H01L 51/0037* (2013.01); *H01L 51/0052* (2013.01)

(56) References Cited

U.S. PATENT DOCUMENTS

| | | |
|---|---|---|
| 5,094,880 A | 3/1992 | Hongoh |
| 5,217,560 A * | 6/1993 | Kurono et al. ............ 156/345.43 |
| 5,304,406 A | 4/1994 | Hongo |
| 5,320,680 A | 6/1994 | Learn et al. |
| 5,512,102 A | 4/1996 | Yamazaki |
| 5,529,630 A | 6/1996 | Imahashi et al. |
| 5,629,922 A | 5/1997 | Moodera et al. |
| 5,650,013 A | 7/1997 | Yamazaki |
| 5,688,551 A | 11/1997 | Littman et al. |
| 6,069,095 A | 5/2000 | Haider |
| 6,080,643 A | 6/2000 | Noguchi et al. |
| 6,132,280 A | 10/2000 | Tanabe et al. |
| 6,265,310 B1 * | 7/2001 | Hoshino ..................... 438/641 |
| 6,274,887 B1 | 8/2001 | Yamazaki et al. |
| 6,275,649 B1 | 8/2001 | Nagashima et al. |
| 6,294,892 B1 | 9/2001 | Utsugi et al. |
| 6,306,764 B1 | 10/2001 | Kato et al. |
| 6,337,102 B1 | 1/2002 | Forrest et al. |
| 6,503,564 B1 | 1/2003 | Fleming et al. |
| 6,504,215 B1 | 1/2003 | Yamanaka et al. |
| 6,558,736 B2 | 5/2003 | Forrest et al. |
| 6,559,036 B1 | 5/2003 | Ohtani et al. |
| 6,635,508 B2 | 10/2003 | Arai et al. |
| 6,716,656 B2 | 4/2004 | Shtein et al. |
| 6,776,847 B2 | 8/2004 | Yamazaki et al. |
| 6,841,653 B2 | 1/2005 | Takahashi et al. |
| 7,015,154 B2 | 3/2006 | Yamazaki et al. |
| 7,015,502 B2 | 3/2006 | Arai et al. |
| 7,316,983 B2 | 1/2008 | Yamazaki et al. |
| 7,431,968 B1 * | 10/2008 | Shtein et al. ................ 427/255.6 |
| 7,674,497 B2 | 3/2010 | Yamazaki et al. |
| 7,763,320 B2 | 7/2010 | Yamazaki et al. |
| 2001/0002279 A1 | 5/2001 | Forrest et al. |
| 2001/0006827 A1 | 7/2001 | Yamazaki et al. |
| 2001/0009154 A1 | 7/2001 | Nguyen et al. |
| 2001/0050054 A1 * | 12/2001 | Kwag et al. .................... 118/715 |
| 2002/0001047 A1 * | 1/2002 | Park et al. ....................... 349/43 |
| 2002/0011205 A1 | 1/2002 | Yamazaki et al. |
| 2002/0179901 A1 * | 12/2002 | Arai et al. ....................... 257/40 |
| 2002/0197393 A1 * | 12/2002 | Kuwabara ....................... 427/66 |
| 2003/0017714 A1 * | 1/2003 | Taniyama et al. .............. 438/758 |
| 2003/0087471 A1 * | 5/2003 | Shtein et al. ..................... 438/82 |
| 2003/0124764 A1 * | 7/2003 | Yamazaki et al. .............. 438/99 |
| 2003/0196597 A1 | 10/2003 | Yamazaki et al. |
| 2003/0221620 A1 * | 12/2003 | Yamazaki ...................... 118/722 |
| 2004/0007178 A1 | 1/2004 | Forrest et al. |
| 2004/0048000 A1 | 3/2004 | Shtein et al. |
| 2004/0065929 A1 * | 4/2004 | Koo et al. ....................... 257/410 |
| 2004/0089232 A1 * | 5/2004 | Sasaki et al. ................... 118/620 |
| 2004/0110326 A1 * | 6/2004 | Forbes et al. ................... 438/149 |
| 2004/0250747 A1 * | 12/2004 | Sasaki et al. ....................... 117/2 |
| 2005/0106322 A1 | 5/2005 | Yamazaki et al. |
| 2005/0140840 A1 * | 6/2005 | Hirakata et al. ................. 349/43 |
| 2005/0208697 A1 | 9/2005 | Seo et al. |
| 2006/0131573 A1 | 6/2006 | Arai et al. |
| 2006/0177580 A1 | 8/2006 | Yamazaki et al. |
| 2007/0131172 A1 | 6/2007 | Forrest et al. |
| 2007/0163713 A1 * | 7/2007 | Kasai et al. ................ 156/345.3 |
| 2008/0081115 A1 | 4/2008 | Yamazaki et al. |
| 2010/0104753 A1 | 4/2010 | Forrest et al. |
| 2010/0159124 A1 | 6/2010 | Yamazaki et al. |

FOREIGN PATENT DOCUMENTS

| | | |
|---|---|---|
| EP | 1 348 694 A1 | 10/2003 |
| EP | 1 384 792 A2 | 1/2004 |
| JP | 02-010721 | 1/1990 |
| JP | 06-507047 | 8/1994 |
| JP | 10-177963 | 6/1998 |
| JP | 2000-340554 | 12/2000 |
| JP | 2001-523768 | 11/2001 |
| JP | 2002-060926 | 2/2002 |
| JP | 2002-246324 | 8/2002 |
| JP | 2002-329676 | 11/2002 |
| JP | 2003-077850 | 3/2003 |
| JP | 2003-313654 | 11/2003 |
| JP | 2004-002401 | 1/2004 |
| JP | 2004-022401 | 1/2004 |
| JP | 2004-055401 | 2/2004 |
| JP | 2004-217968 | 8/2004 |
| WO | WO-92/19790 A2 | 11/1992 |
| WO | WO-99/25894 | 5/1999 |
| WO | WO 03/020999 A1 | 3/2003 |
| WO | WO 03/034471 A1 | 4/2003 |
| WO | WO2004019399 * | 4/2004 |

OTHER PUBLICATIONS

International Search Report for PCT/JP2005/014801 Dated Nov. 15, 2005.

Written Opinion of the International Searching Authority for PCT/JP2005/014801 Dated Nov. 15, 2005.

Office Action received in Chinese Patent Application No. 200580027389.8(PCTCN8096) dated Jun. 6, 2008 with English translation.

\* cited by examiner

METHOD FOR MANUFACTURING SEMICONDUCTOR DEVICE INCLUDING ORGANIC SEMICONDUCTOR

This application claims the benefit of International PCT Patent Application No. PCT/JP2005/014801, filed Aug. 5, 2005, which claims the benefit of Japanese Patent Application No. 2004-236156, filed Aug. 13, 2004, the disclosures of which are hereby incorporated by reference in their entirety.

TECHNICAL FIELD

The present invention relates to a method for manufacturing a semiconductor device, and more particularly such a method for manufacturing a transistor having an active layer made from an organic compound.

BACKGROUND ART

In recent years, an organic transistor having an active layer made from an organic compound has been actively developed. In a manufacturing process for the organic transistor, for example, as disclosed in Patent document 1, the active layer is formed by a deposition method such as an OVPD (Organic Vapor Phase Deposition) method.

Meanwhile, an organic compound is attached to the inside of a processing chamber after depositing in a deposition apparatus used for forming the active layer. Mixing the attached organic compound into the active layer as an impurity may brings characteristic deterioration of a transistor. Therefore, it is required to develop technique by which an active layer with high purity can be formed.

Patent document 1: "Self-Organized Organic Thin-film Transistor for Flexible Active-Matrix Display", Sung Hwam Kim et al., SID 04 DIGEST, pp. 1294-1297

DISCLOSURE OF INVENTION

It is an object of the present invention to provide a method for manufacturing a semiconductor device which can reduce characteristic deterioration due to impurity incorporation. It is another object of the present invention to provide a semiconductor device and an electric appliance with reduced characteristic deterioration due to impurity incorporation.

The method for manufacturing a semiconductor device has a process for depositing an organic semiconductor over a subject to be treated. In addition, a process for introducing a gas having low reactivity and exhausting the gas having low reactivity while heating a treater so that temperature in the inside of the treater is higher than sublimation temperature of the organic semiconductor after taking out the subject deposited with the organic semiconductor from the treater.

Here, the subject is preferably heated to a lower temperature than sublimation temperature of the organic semiconductor. As the gas having low reactivity, inert gas such as nitrogen gas or rare gas is preferably used.

The method for manufacturing a semiconductor device has a process for forming the active layer. The process for forming the active layer includes a first process for depositing a sublimed organic semiconductor on a subject, and a second process for introducing and exhausting gas having low reactivity while heating a treater so that temperature in the inside of the treater is higher than sublimation temperature of the organic semiconductor after taking out the subject deposited with the organic semiconductor from the treater.

Here, the subject is preferably heated to reach a lower temperature than sublimation temperature of the organic semiconductor. As the gas having low reactivity, inert gas such as nitrogen gas or rare gas is preferably used.

The semiconductor device according to the present invention is manufactured by using a manufacturing method capable of reducing impurity incorporation. Therefore, a semiconductor device or an electric appliance with reduced element deterioration due to an impurity mixed into an active layer can be obtained.

These and other objects, features and advantages of the present invention will become more apparent upon reading of the following detailed description along with the accompanied drawings.

BEST MODE FOR CARRYING OUT THE INVENTION

Embodiment 1

Figure 1A:
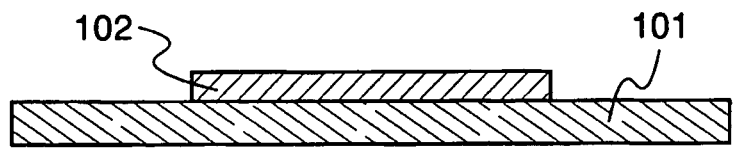
FIGS. 1A to 1D are explanatory views for showing a method for manufacturing the semiconductor device according to the present invention.
Figure 1B:
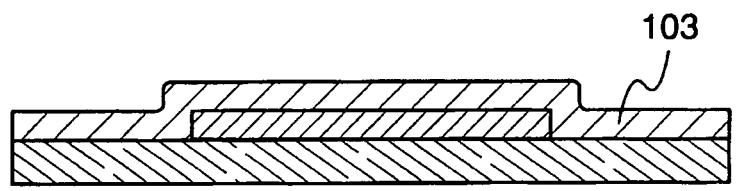
Figure 1C:
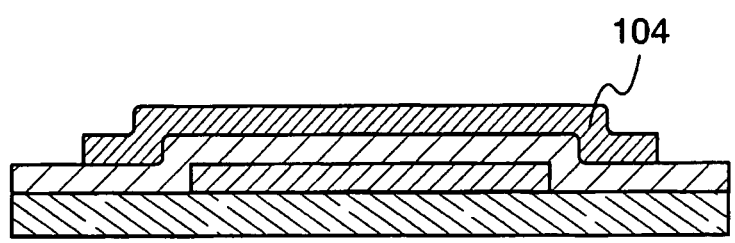
Figure 1D:
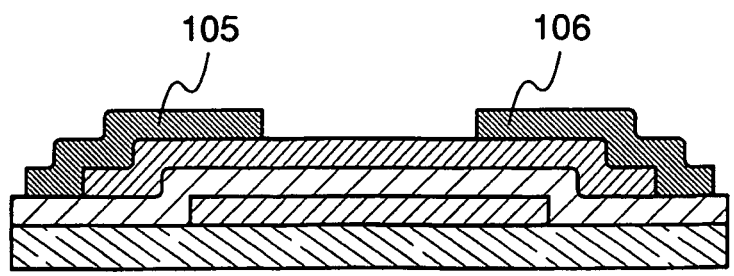

A method for manufacturing a semiconductor device according to the present invention is explained with reference to FIGS. 1A to 1D.

A gate electrode 102 is formed over a substrate 101. A method for forming the gate electrode 102 is not restricted. The gate electrode 102 may be formed by patterning a formed conductive layer into a desired pattern by a photolithography method or drawing a desired pattern with droplets containing a conductive material by an ink jet method or the like by discharging with adjusting timing and position. As a material for forming the gate electrode 102, aluminum, copper, gold, silver, or the like can be, but not exclusively, used. The substrate 101 is not restricted, for example, a flexible substrate such as plastic or polycarbonate can be used in addition to glass, quartz, or the like.

Then, a gate insulating layer 103 is formed over the gate electrode 102. The gate insulating layer 103 is not restricted, for example, insulator such as silicon oxide or silicon nitride can be formed by a CVD method as the gate insulating layer 103. Besides, an organic material such as polyimide, polyamic acid, or polyvinylphenol may be coated by a cast method, a spinner method, a printing method, an ink jet method, or the like as the gate insulating layer 103, although it depends on applied temperature on a subject during forming a film.

Then, an active layer 104 is formed over the gate insulating layer 103. A method for forming the active layer 104 is not restricted. For example, it is possible that water-shedding treatment is selectively carried out for a portion where one intends to form the active layer 104, and water-attracting treatment for the other portion is carried out, then, a self-organized semiconductor layer is formed. Accordingly, a semiconductor which has a property of growing in a water-shedding treated region such as pentacene can be processed into a desired shape without patterning after forming the semiconductor film. Further, the active layer 104 can be formed by forming a semiconductor layer selectively in a desired portion by using a shadow mask or the like. In that case, adhesiveness between the shadow mask and a subject is preferably improved so that the semiconductor layer is prevented from forming due to depositing a raw material which discharges from the gap between the shadow mask and the subject in a portion which does not require to be provided with the semiconductor layer. The active layer 104 can be formed by forming a semiconductor layer and processing the semiconductor layer into a desired shape. In that case, vacuum baking treatment or the like is preferably carried out after processing. According to such the treatment, characteristics of a semiconductor device are improved.

Before forming the semiconductor layer, a self-organized film (which is formed spontaneously and has a monomolecular film in the through-thickness direction) is preferably formed over a surface of the gate insulating layer 103. The self-organized film can be formed by, for example, a silane derivative having an amino group. Specifically, octadecyltrichlorosilane, (3-aminopropyl)trimethoxysilane, N-2(aminoethyl)γ-aminopropylmethyldimethoxysilane, N-2(aminoethyl)γ-aminopropyltrimethoxysilane, 3-aminopropyltrimethoxysilane, or the like can be used. The self-organized film can be formed by treating the surface of the gate insulating layer 103 with solution in which the foregoing substances are dissolved in solvent such as toluene or hexane. Accordingly, film formation at an arbitrary region can be controlled and crystallinity can be improved, and so a transistor having high mobility can be obtained. Further, a semiconductor layer can be formed after rubbing treatment of the surface of the gate insulating layer 103. Hence, orientation of the semiconductor layer becomes easily aligned.

Figure 2:
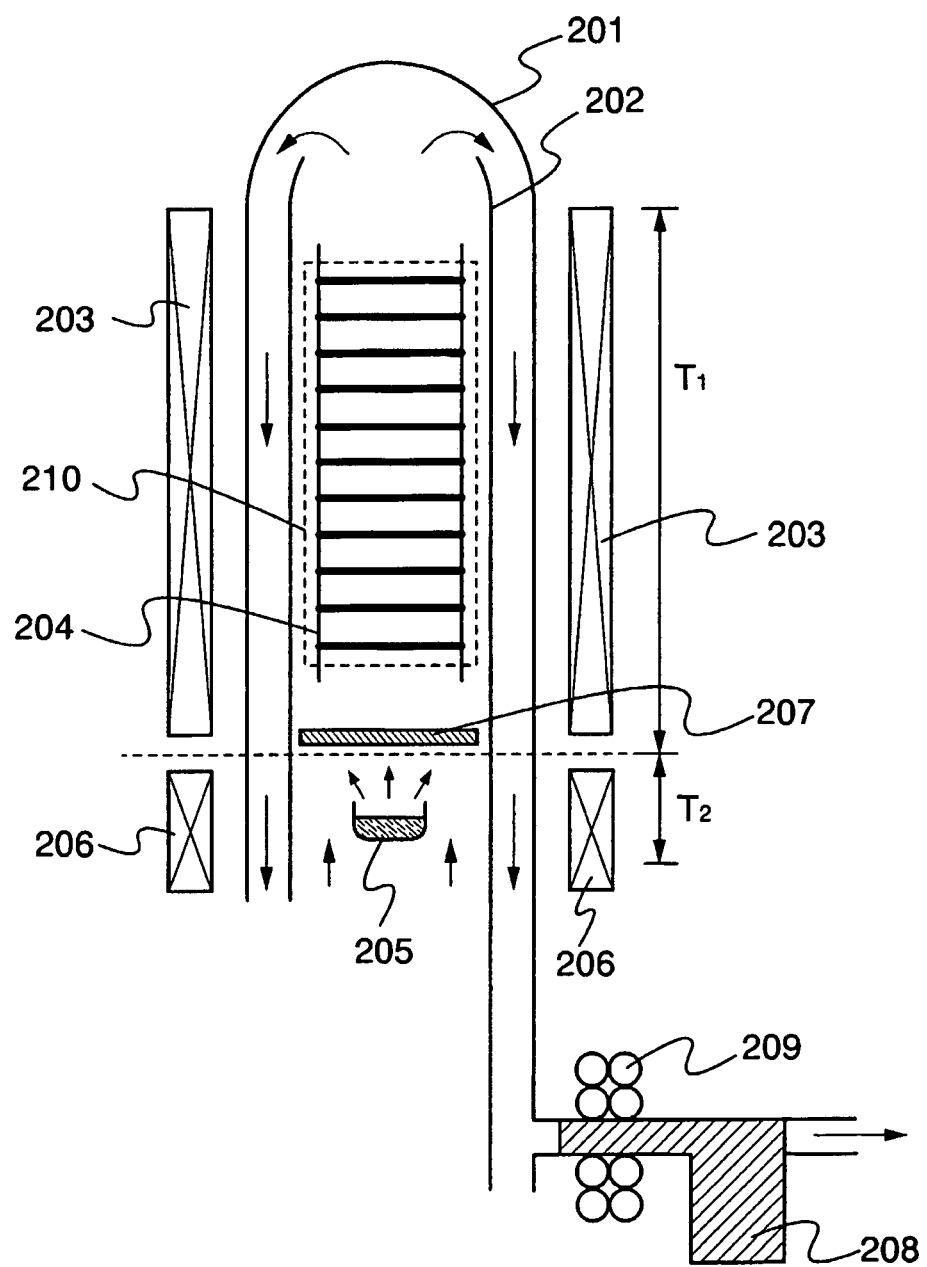
FIG. 2 is a view for showing a deposition system used for implementing the present invention.
Figure 3A:
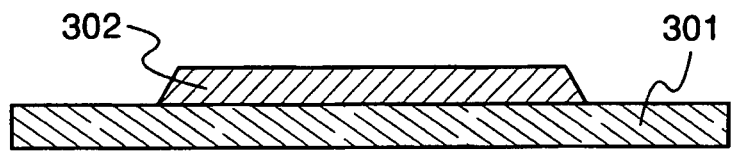
FIGS. 3A to 3D are explanatory views for showing a method for manufacturing the semiconductor device according to the present invention.
Figure 3B:
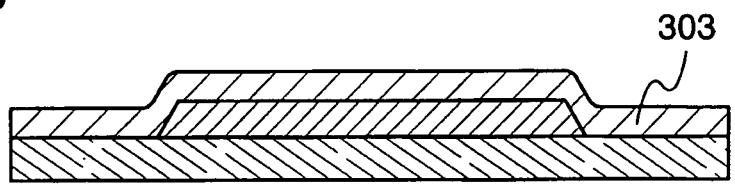
Figure 3C:
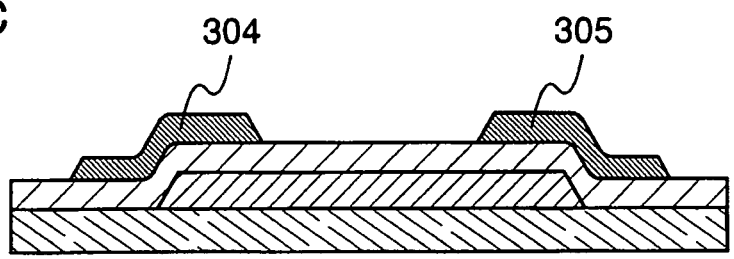
Figure 3D:
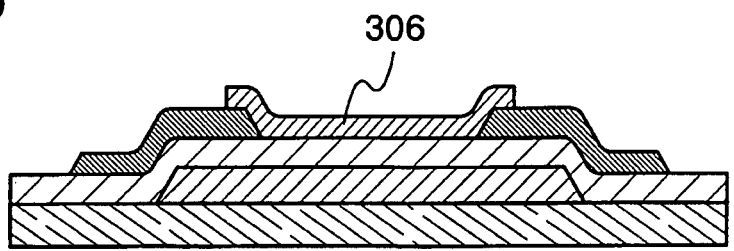
Figure 4A:
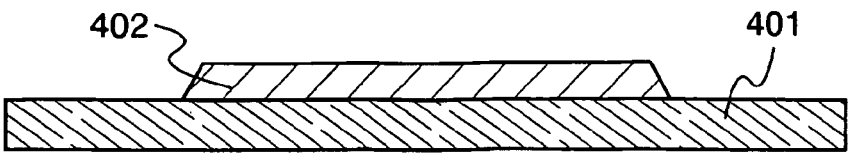
FIGS. 4A to 4F are explanatory views for showing a method for manufacturing the semiconductor device according to the present invention.
Figure 4B:
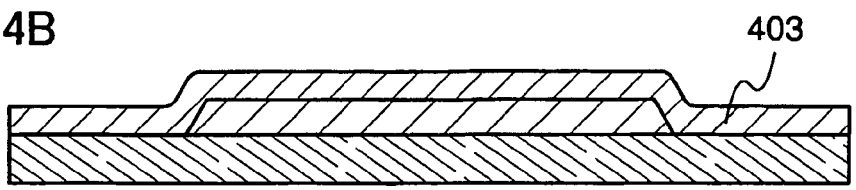
Figure 4C:
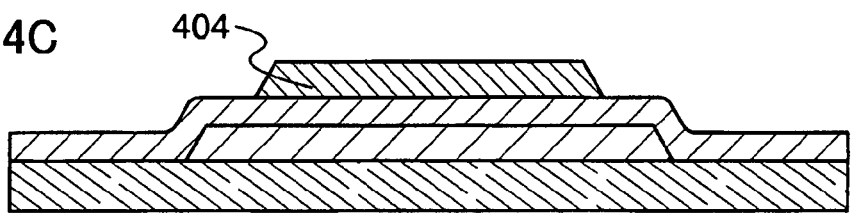
Figure 4D:
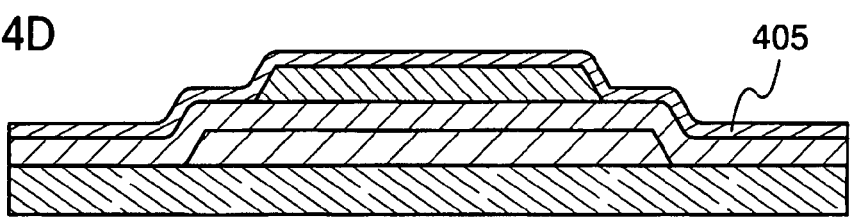
Figure 4E:
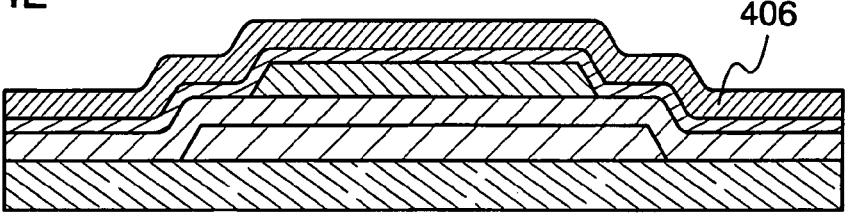
Figure 4F:
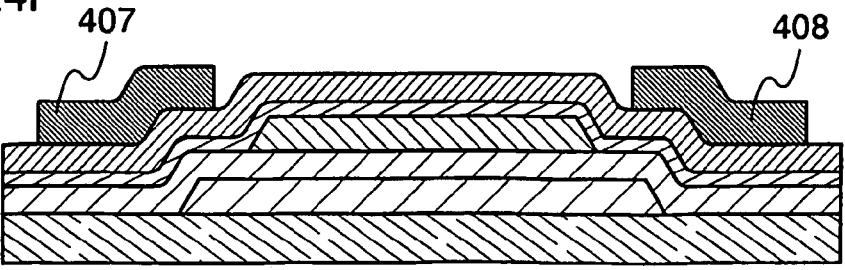

The active layer 104 is vapor deposited. Here, a deposition system used for implementing the present invention is explained with reference to FIG. 2. The deposition system illustrated in FIG. 2 comprises a tube 201, a treater composed of the tube 201 and a tube 202 provided to the inside of the tube 201, and a heater 203 provided so as to surround the flank of the tube 201. A tip of the tube 201 is formed to have a shape with curvature. A tip of the tube 202 is opened. The tip of the tube 201 and the opening of the tube 202 are overlapped with each other. According to such the structure, gas passing through the tube 202 to be flown from an opening of the tube 202 is allowed to flow easily along a side wall of the tube 201 and flow smoothly between the tube 201 and the tube 202. Accordingly, turbulence of airflow of gas flowing in the system is reduced, which leads to uniform deposition. When depositing a film, a boat 204 mounted with at least one subject (indicated by dotted line 210) is carried in the inside of the tube 202. In this embodiment, the subject is the substrate 101 provided with the gate electrode 102 or the like. The boat 204 is heated by a heater 203. It is possible that a plurality of subjects are mounted to the boat 204 at once for efficient processing. A raw material is in a crucible 205 and heated by a heater 206 to be sublimed. Since sublimation components immediately after the heating contain impurities, impurities are prevented from depositing directly over the subject by a shutter 207. After flowing gas containing impurity components and inert gas for the specified time, the shutter 207 is opened, and the sublimed raw material is introduced together with nitrogen gas or another inert gas to the inside the tube 202, and the material is deposited on the subject. Here, the treater is preferably set to low pressure of from 0.1 to 50 torr. Accordingly, a uniform film can be formed. Further, the temperature of the subject is preferably made lower 70 to 130° C. than that of the raw material during subliming. An area including the crucible 205 provided to protect and heat the raw material and the subject is preferably set to have a gradual temperature gradient. The temperature gradient is not always required to be a smooth gradient but a crooked gradient. Specifically, the temperature gradient may have two kinds or more gradients, that is, the temperature gradient may include a temperature gradient of from the crucible 205 to a closest subject ($\Delta$Ta) and a temperature gradient of from the foregoing subject to a farthest subject from the foregoing subject ($\Delta$Tb). In the case of having two kinds of gradients, the gradients may be $\Delta$Ta≥$\Delta$Tb. In the case of having two or more kinds of gradients, the temperature gradient around the subject is preferably small. The temperature gradient around the subject is preferably small even in the case of two or more kinds of gradients. Moreover, it is preferable that a temperature is lower with increasing distance from the crucible 205. For that purpose, temperature ($T_1$) of the heater 203 for heating a portion provided with the boat is preferably set lower than temperature ($T_2$) of the heater 206 for heating the raw material. FIG. 2 illustrates that the heater is two systems. However, the number of systems of the heater is not restricted, and so the heater may be two or more systems. By increasing the number of systems, temperature distribution can be further precisely controlled. Further, remaining gas passes between the tube 201 and the tube 202 and exhausts from an exhaust port.

The exhausted remaining gas contains an organic semiconductor which is a raw material. The raw material is generally expensive, and so the raw material is preferably collected to be reused in consideration of the impact on the environment. A collect box 208 illustrated in FIG. 2 is a box for collecting a raw material in remaining gas by cooling to agglutinate the remaining gas with a cooler 209 while passing through the collect box 208.

After taking out the subject from the treater, a raw material which is attached to the inside of the treater during depositing is preferably removed by flowing nitrogen gas or the other inert gas in the state that temperature of the inside of the treater is made higher than sublimation temperature of the raw material. For that purpose, the temperature of the heaters 203, 206 are, for example, preferably set to a temperature ($T_3$) which is higher than the foregoing temperatures ($T_1$, $T_2$). By removing the raw material attached to the inside of the treater in such a way, a film which is mixed with reduced impurities and has favorable characteristics can be formed. A raw material is desirably collected from remaining gas in exhausting during cleaning as with during depositing as mentioned above.

As noted above, the deposition system illustrated in FIG. 2 is suitable for mass production, which can process a plurality of subjects at once. Further, the deposition system can clean easily organic materials attached to the treater and form continuously a good quality film.

Figure 10:
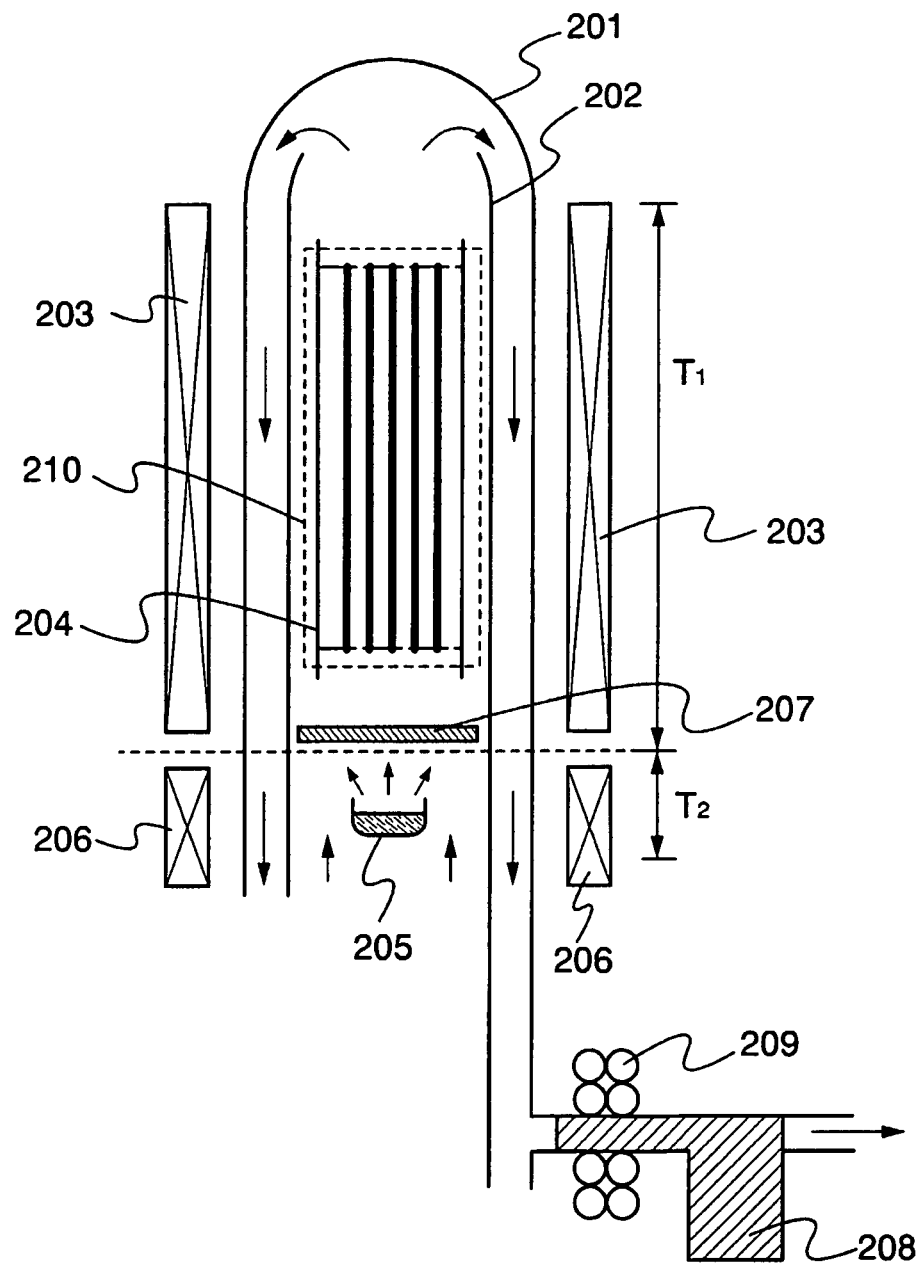
FIG. 10 is a view for showing a deposition apparatus used for implementing the present invention.

It is not restricted how the subject is mounted to the boat 204. Deposition distribution can be uniformed by arranging the subject and a raw material supply source so that a deposition surface of the subject (the deposition surface is a surface over which a raw material is deposited to form a film) and the raw material supply source (crucible 205 corresponds to the raw material supply source in FIG. 2) are opposed to each other and the direction of a normal line of the deposition surface and the direction of gravitational force become parallel with each other, that is, the raw material supply source is placed below the subject. Moreover, the rate of attaching refuse during depositing to the subject can be decreased. This is due to the fact that refuse from the shutter or the like or refuse from a material easily attached to the tube thickly fall and attach to the subject in the case of placing the raw material supply source on the upper side. Therefore, the raw material supply source is preferably placed on the lower side, whereas the subject is preferably placed on the upper side. However, it is not exclusively if measures against refuse are considered. Alternatively, the subject and the raw material supply source may be placed so that the direction of the deposition surface of the subject and the direction of gravitational force become parallel with each other as illustrated in FIG. 10. In such a way, the rate of attaching refuse during depositing to the subject can be decreased.

Electrodes 105, 106 are formed over the active layer 104. The electrodes 105, 106 are not restricted. Besides an inorganic conductive material such as gold or silver, an organic conductive material or the like including poly(ethylenedioxythiophene)/poly(styrenesulfonic acid) solution (PEDOT/PSS) or the like can be used as the material for these electrodes. A method for forming the electrodes 105, 106 is not restricted. These electrodes may be formed by processing a conductive layer deposited by a sputtering apparatus or a deposition apparatus into a desired shape or by drawing a desired pattern with droplets containing a conductive material by an ink jet method or the like by discharging with adjusting timing and position.

Before forming the electrodes 105, 106, a self-organized film may be formed over the active layer 104 to be provided between the electrodes 105, 106 and the active layer 104. Accordingly, contact resistance between the electrodes 105, 106 and the active layer 104 can be lowered. Here, the self-organized film can be formed by alkylsilane or the like including an amino group. Specifically, the self-organized film can be formed by octadecyltrichlorosilane, (3-aminopropyl)trimethoxysilane, N-2(aminoethyl)γ-aminopropylmethyldimethoxysilane, N-2(aminoethyl)γ-aminopropyltrimethoxysilane, 3-aminopropyltrimethoxysilane, or the like.

The semiconductor device according to the present invention manufactured as mentioned above includes a three-terminal transistor having the gate electrode 102, and the electrodes 105, 106. Here, either of the electrodes 105, 106 serves as a source, whereas the other serves as a drain. Such the semiconductor device including the three-terminal transistor is used as a switching circuit of a liquid crystal element, a logic circuit, a memory circuit of a DRAM, or the like.

Since the semiconductor device manufactured as mentioned above includes the active layer 104 which is mixed with little impurities and which has favorable characteristics, the semiconductor device has good operating characteristics and high reliability.

Embodiment 2

A method for manufacturing a semiconductor device according to the present invention is explained with reference to FIG. 3.

A gate electrode 302 is formed over a substrate 301. A method for forming the gate electrode 302 is not restricted. The gate electrode 302 may be formed by patterning a formed conductive layer into a desired pattern by a photolithography method or by drawing a desired pattern with droplets containing a conductive material by an ink jet method or the like by discharging with adjusting timing and position. As a material for forming the gate electrode 302, aluminum, copper, gold, silver, or the like can be, but not exclusively, used. By forming the gate electrode 302 to have an inclined side wall as in this embodiment, the coverage of a gate insulating layer 303 to be provided afterward is improved. The substrate 301 is not restricted, for example, a flexible substrate such as plastic can be used in addition to glass, quartz, or the like.

Then, a gate insulating layer 303 is formed over the gate electrode 302. The gate insulating layer 303 is not restricted, for example, the gate insulating layer 303 can be formed by an insulator such as silicon oxide or silicon nitride by a CVD method. Besides, an organic material such as polyimide, polyamic acid, or polyvinylphenol may be coated by a cast method, a spinner method, a printing method, an ink jet method, or the like as the gate insulating layer 303, although it depends on applied temperature on a subject during forming a film.

Electrodes 304, 305 are formed over the gate insulating layer 303. The electrodes 304, 305 are not restricted. The electrodes 304, 305 may be formed by an organic conductive material or the like including PEDOT or the like besides an inorganic material such as gold or silver. Further, a method for forming the electrodes 304, 305 is not restricted. These electrodes may be formed by processing a conductive layer deposited by a sputtering apparatus or a deposition apparatus into a desired shape or by drawing a desired pattern with droplets containing a conductive material by an ink jet method or the like by discharging with adjusting timing and position.

An active layer 306 is formed over the gate insulating layer 303 and the electrodes 304, 305. The active layer 306 is not restricted. For example, the active layer 306 may be formed by pentacene or the like. As with the active layer 104 described in Embodiment 1, a method for manufacturing the active layer 306 is not restricted. For example, it is possible that water-shedding treatment is selectively carried out for a portion where one intends to form the active layer 306, and water-attracting treatment for the other portion is carried out, then, a self-organized semiconductor layer is formed. Accordingly, a semiconductor which has a property of growing in a water-shedding treated region such as pentacene can be processed into a desired shape without patterning after forming the semiconductor film. Further, the active layer 306 can be formed by forming a semiconductor layer selectively in a desired portion by using a shadow mask or the like. In that case, adhesiveness between the shadow mask and a subject is preferably improved so that the semiconductor layer is prevented from forming due to depositing a raw material which discharges from the gap between the shadow mask and the subject in a portion which does not require to be provided with the semiconductor layer. The active layer 306 can be formed by forming a semiconductor layer and processing the semiconductor layer into a desired shape. In that case, vacuum baking treatment or the like is preferably carried out after processing. According to such the treatment, characteristics of a semiconductor device are improved.

Before forming the semiconductor layer, a self-organized film is preferably formed over a surface of the gate insulating layer 303. The self-organized film can be formed by alkylsilane or the like having an amino group. Specifically, octadecyltrichlorosilane, (3-aminopropyl)trimethoxysilane, N-2 (aminoethyl)γ-aminopropylmethyldimethoxysilane, N-2 (aminoethyl)γ-aminopropyltrimethoxysilane, 3-aminopropyltrimethoxysilane, or the like can be used. Film formation at an arbitrary region can be controlled and crystallinity can be improved, and so a transistor having high mobility can be obtained. By providing a self-organized film between the electrodes 304, 305 and the active layer 306, contact resistance between the electrodes 304, 305 and the active layer 306 can be lowered.

The raw material which is attached to a treater during depositing is preferably removed by flowing nitrogen gas or another inert gas in the state that the temperature in the treater is set higher than sublimation temperature of the raw material. By removing raw material which is attached to a treater after deposition, a film which is mixed with little impurities and which has good characteristics can be formed. The removed raw material is preferably collected.

The semiconductor device manufactured as mentioned above includes a three-terminal transistor having the gate electrode 302, and the electrodes 304, 305. Here, either of the electrodes 304, 305 serves as a source, whereas the other serves as a drain. Such the semiconductor device including the three-terminal transistor is used as a switching circuit of a liquid crystal element, a logic circuit, a memory circuit of a DRAM, or the like.

Since the semiconductor device manufactured as mentioned above includes the active layer 306 which is mixed with little impurities and which has favorable characteristics, the semiconductor device has good operating characteristics and high reliability.

Embodiment 3

A method for manufacturing a semiconductor device according to the present invention is explained with reference to FIG. 4.

A first gate electrode 402 is formed over a substrate 401. A method for manufacturing the first gate electrode 402 is not restricted. The first gate electrode 402 may be formed by patterning a formed conductive layer into a desired pattern by a photolithography method or drawing a desired pattern with droplets containing a conductive material by an ink jet method or the like by discharging with adjusting timing and position. As a material for forming the first gate electrode 402, aluminum, copper, gold, silver, or the like can be, but not exclusively, used. The substrate 401 is not restricted, for example, a flexible substrate such as plastic or polycarbonate can be used in addition to glass, quartz, or the like.

A gate insulating layer 403 for covering the first gate electrode 402 is formed. The gate insulating layer 403 is not restricted. For example, the gate insulating layer 403 may be formed by an insulator such as silicon oxide or silicon nitride by a CVD method or the like.

A second gate electrode 404 is formed over the gate insulating film 403 so as to be overlapped with the first gate electrode 402. The second gate electrode 404 is not restricted. For example, the second gate electrode 404 can be formed by a semiconductor or the like including an impurity such as silicon containing phosphorus or boron. A method for manufacturing the second gate electrode 404 is not restricted. The second gate electrode 404 may be formed by patterning a formed conductive layer into a desired pattern by a photolithography method or drawing a desired pattern with droplets containing a conductive material by an ink jet method or the like by discharging with adjusting timing and position.

By forming the gate insulating layer 403 so as to cover the first gate electrode 402 after forming the first gate electrode 402 as noted above, an active layer 406 to be formed in the process afterwards and the first gate electrode 402 can be prevented from interfering in each other.

An insulating layer 405 for covering the second gate electrode 404 is formed. A method for forming the insulating layer 405 is not restricted. For example, the insulating layer 405 may be formed by an insulator such as silicon oxide or silicon nitride by a CVD method. The insulating layer 405 is preferably formed to have a thickness having an energy barrier which allows that electrons are injected from the active layer 406 to the second gate electrode 404 when operating a semiconductor device.

The active layer 406 is formed over the insulating layer 405. A method for forming the active layer 406 is not restricted. As with the active layer 104 described in Embodiment 1, the active layer 406 is preferably formed by depositing a semiconductor layer by a deposition apparatus as illustrated in FIG. 2 and by processing the semiconductor layer into a desired shape. Here, the active layer 406 is not restricted. For example, pentacene or the like may be used for the active layer 406.

The raw material which is attached to a treater during depositing is preferably removed by flowing nitrogen gas or another inert gas in the state that the temperature in the treater is made higher than sublimation temperature of the raw material. By removing the raw material which is attached to a treater after deposition, a film which is mixed with little impurities and which has good characteristics can be formed.

Electrodes 407, 408 are formed over the active layer 406. The electrodes 407, 408 are not restricted. Besides an inorganic conductive material such as gold or silver, an organic conductive material or the like including PEDOT or the like can be used as the material for these electrodes. A method for forming the electrodes 407, 408 is not restricted. These electrodes may be formed by processing a conductive layer deposited by a sputtering apparatus or a deposition apparatus into a desired shape or by drawing a desired pattern with droplets containing a conductive material by an ink jet method or the like by discharging with adjusting timing and position.

Before forming the electrodes 407, 408, a self-organized film may be formed between the electrodes 407, 408 and the active layer 406. Accordingly, contact resistance between the electrodes 407, 408 and the active layer 406 can be lowered. Here, the self-organized film can be formed by alkylsilane or the like including an amino group. Specifically, the self-organized film can be formed by octadecyltrichlorosilane, (3-aminopropyl)trimethoxysilane, N-2(aminoethyl)γ-aminopropylmethyldimethoxysilane, N-2(aminoethyl)γ-aminopropyltrimethoxysilane, 3-aminopropyltrimethoxysilane, or the like.

The semiconductor device manufactured as mentioned above includes a three-terminal transistor having the first gate electrode 402, and the electrodes 407, 408. Here, either of the electrodes 407, 408 serves as a source, whereas the other serves as a drain. The semiconductor device according to the present invention has functions of erasing and writing data by trapping electrons in the second gate electrode 404 or releasing electrons from the second gate electrode 404. The first gate electrode 402 serves as a so-called control gate. The second gate electrode 404 serves as a so-called floating gate.

In this embodiment, the active layer is formed and the electrode serving as a source or a drain is formed thereover. However, the present invention is not restricted thereto. For example, the electrode serving as a source or a drain can be formed and the active layer covering at least a part of the electrode can be formed as with Embodiment 2.

As noted above, since the semiconductor device manufactured as mentioned above includes the active layer 406 which is mixed with little impurities and which has favorable characteristics, the semiconductor device has good operating characteristics and high reliability.

Embodiment 4

An embodiment of a liquid crystal device including the semiconductor device according to the present invention is explained with reference to FIG. 5.

Figure 5:
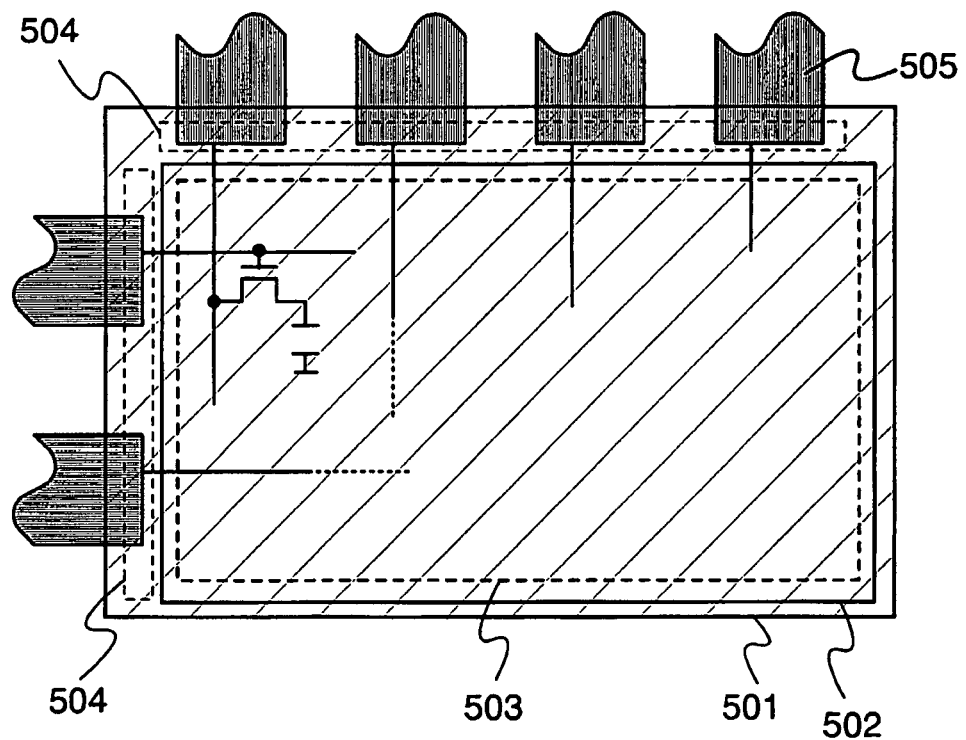
FIG. 5 is a top view of a liquid crystal device including the semiconductor device according to the present invention.

FIG. 5 is a top view for showing schematically the liquid crystal device. The liquid crystal device according to this embodiment is formed by pasting an element substrate 501 and an opposing substrate 502 so as to be opposed to each other. The liquid crystal device according to this embodiment has a pixel portion 503. A terminal portion 504 provided along the side of the pixel portion 503 is attached with a flexible printed wiring (FPC) 505. A signal is input to the pixel portion 503 from a driver circuit via the flexible printed wiring 505. As in this embodiment, the driver circuit and the flexible printed wiring can be provided independently, alternatively, can be combined as with a TCP in which an IC chip is mounted over an FPC provided with a wiring pattern.

Figure 6A:
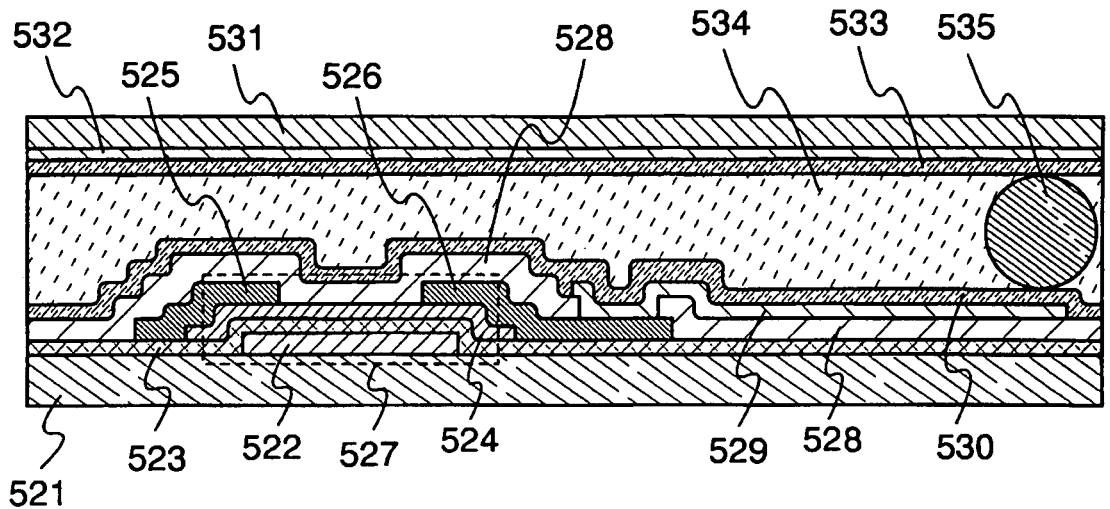
FIGS. 6A and 6B are cross-sectional views of a liquid crystal device including the semiconductor device according to the present invention.
Figure 6B:
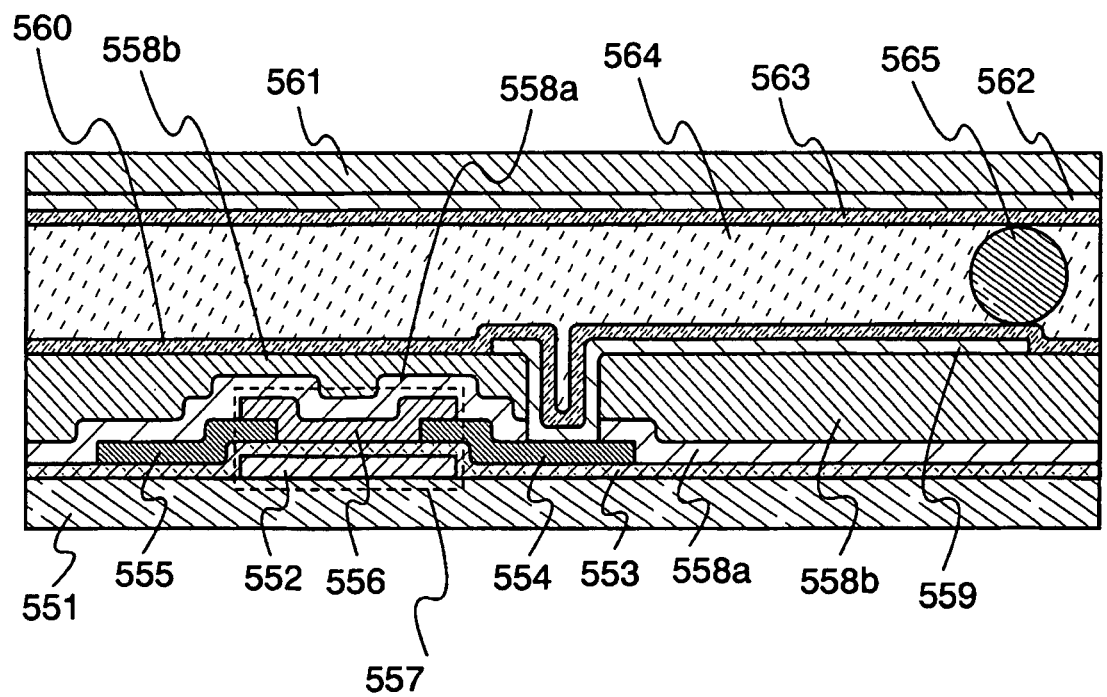

The pixel portion 503 is not restricted. For example, as illustrated in cross-sectional views in FIG. 6A or 6B, the pixel portion 503 includes the liquid crystal and a transistor for driving the liquid crystal. FIGS. 6A and 6B illustrate embodiments of cross-sectional structures of a liquid crystal device which have different transistor structures from each other.

The liquid crystal device represented by a cross-sectional view in FIG. 6A has an element substrate 521 provided with a transistor 527 having electrodes 525, 526 serving as a source or a drain over an active layer 524 as with the semiconductor device described in Embodiment 1. A liquid crystal element is formed by interposing a liquid crystal layer 534 between a pixel electrode 529 and an opposing electrode 532. Oriented films 530, 533 are provided over the surfaces, which are in contact with the liquid crystal layer 534, of the pixel electrode 529 and the opposing electrode 532. The liquid crystal layer 534 is dispersed with spacers 535 to hold a cell gap. The transistor 527 is covered by an insulating layer 528 provided with a contact hole. An electrode 526 and the pixel electrode 529 are electrically connected to each other. The opposing electrode 532 is supported by an opposing substrate 531. In the transistor 527, an active layer 524 is overlapped with a gate electrode 522 via a gate insulating layer 523.

The liquid crystal device represented by a cross-sectional view in FIG. 6B has an element substrate 551 which includes a transistor 557 having a structure in which at least a part of electrodes 555, 554 serving as a source or a drain is covered by an active layer 556 as with the semiconductor device described in Embodiment 2. Further, a liquid crystal element is formed by interposing a liquid crystal layer 564 between a pixel electrode 559 and an opposing electrode 562. Oriented films 560, 563 are provided over the surfaces of the pixel electrode 559 and the opposing electrode 562 which are in contact with the liquid crystal layer 564. The liquid crystal layer 564 is dispersed with spacers 565 to hold a cell gap. The transistor 557 is covered by insulating layers 558a, 558b provided with a contact hole. An electrode 554 and the pixel electrode 559 are electrically connected to each other. The insulating layer covering the transistor may have a multilayer structure composed of the insulating layers 558a, 558b as illustrated in FIG. 6B, alternatively, a single layer structure composed of the insulating layer 528 as illustrated in FIG. 6A. The insulating layer covering the transistor may be a layer with a flattened surface like the insulating layer 558b as illustrated in FIG. 6B. The opposing electrode 562 is supported by an opposing substrate 561. In the transistor 557, an active layer 556 is overlapped with a gate electrode 552 via a gate insulating layer 553.

A structure of the liquid crystal device is not restricted. Besides the embodiment described in this embodiment, for example, the structure of the liquid crystal device may have a driver circuit over an element substrate.

Figure 7A:
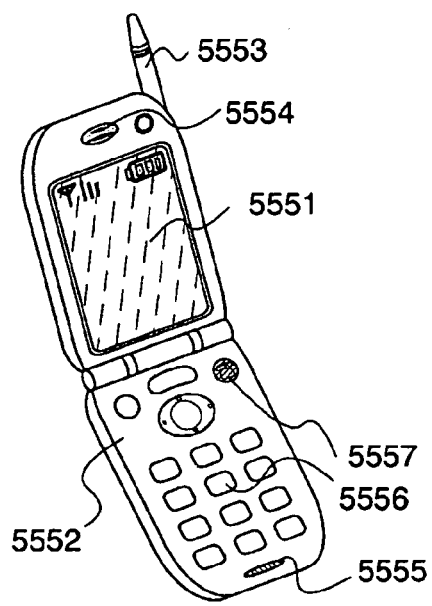
FIGS. 7A to 7C are electric appliances applied with the present invention.
Figure 7B:
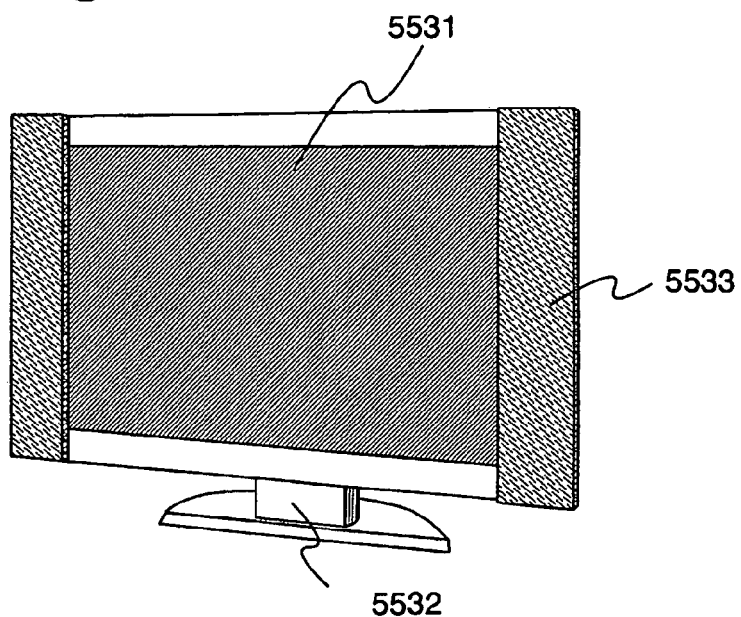
Figure 7C:
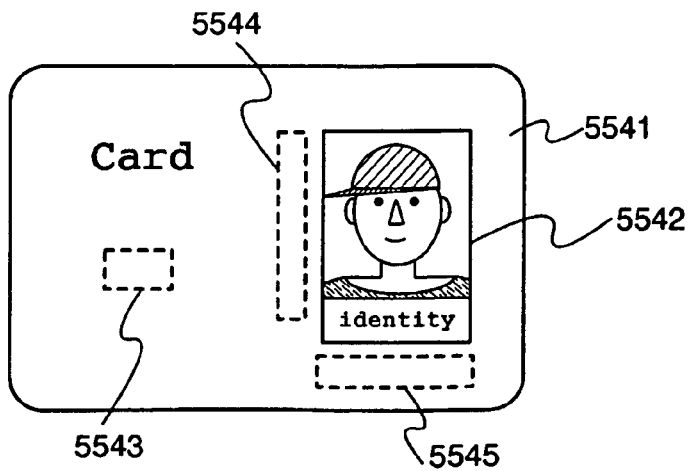

The liquid crystal device as noted above can be used as a display device mounted to a telephone set or a television set as illustrated in FIGS. 7A to 7C. The liquid crystal device can also be mounted to a card or the like having a function of managing private information such as an ID card.

FIG. 7A illustrates a telephone set. A main body 5552 of the telephone set comprises a display portion 5551, a voice output portion 5554, a voice input portion 5555, operation switches 5556, 5557, an antenna 5553, and the like. The telephone set has good operational characteristics and high reliability. The telephone set can be completed by incorporating the display device according to the present invention into the display portion.

FIG. 7B illustrates a television set manufactured by applying the present invention. The television set comprises a display portion 5531, a housing 5532, a speaker 5533, and the like. The television set has good operational characteristics and high reliability. The television set can be completed by incorporating the display device according to the present invention into the display portion.

FIG. 7C illustrates an ID card manufactured by applying the present invention. The ID card comprises a support medium 5541, a display portion 5542, an integrated circuit chip 5543, or the like incorporated into the support medium 5541. Integrated circuits 5544, 5545 are incorporated into the support medium 5541. The ID card has high reliability. For example, what kind of information is input or output can be confirmed by displaying information input or output to an integrated circuit chip 5543 on the display portion 5542.

Embodiment 5

A memory device including the semiconductor device according to the present invention is explained with reference to a block diagram in FIG. 8.

Figure 8:
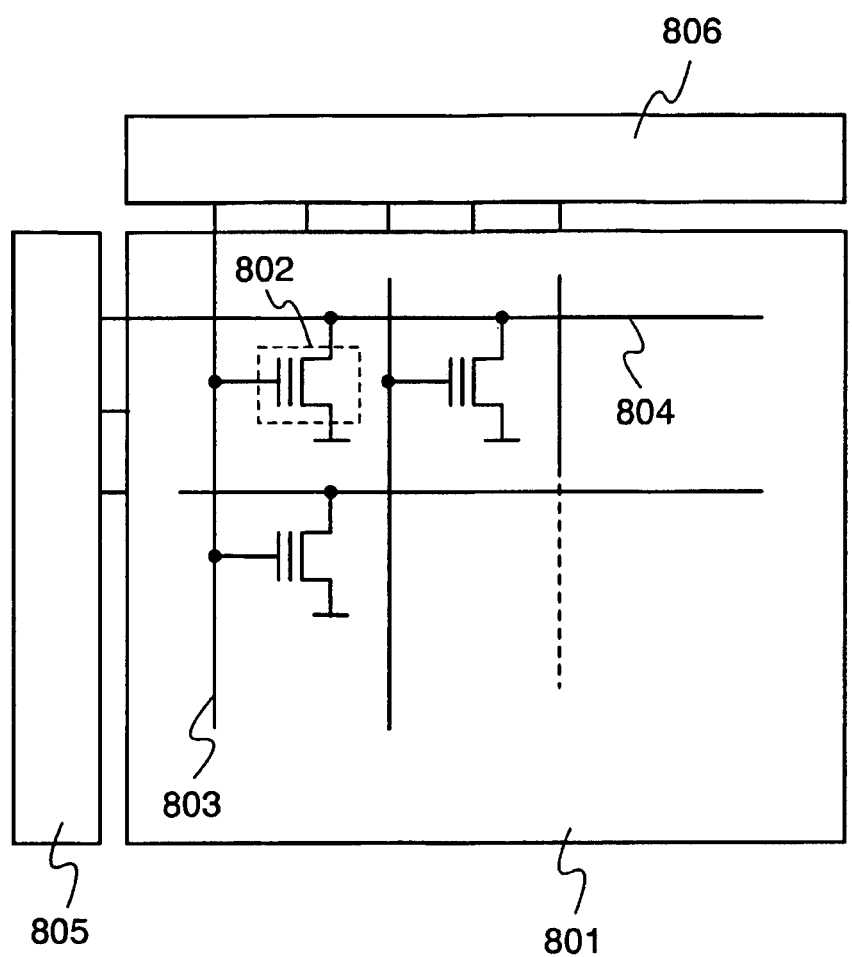
FIG. 8 is a view for showing a memory device including the semiconductor device according to the present invention.

FIG. 8 is a circuit diagram of a memory device including a memory element which is similar to that described in Embodiment 3. In a memory cell array 801, a memory element 802 is arranged in rows and in columns. A gate electrode included in each the memory element 802 arranged in one column is electrically connected to a common word line 803. A drain electrode included in each the memory element 802 arranged in one line is connected to a common bit line 804.

Data stored in the memory cell array 801 or data to be stored in the memory cell array 801 is read out or written by periphery circuits 805, 806.

Figure 9:
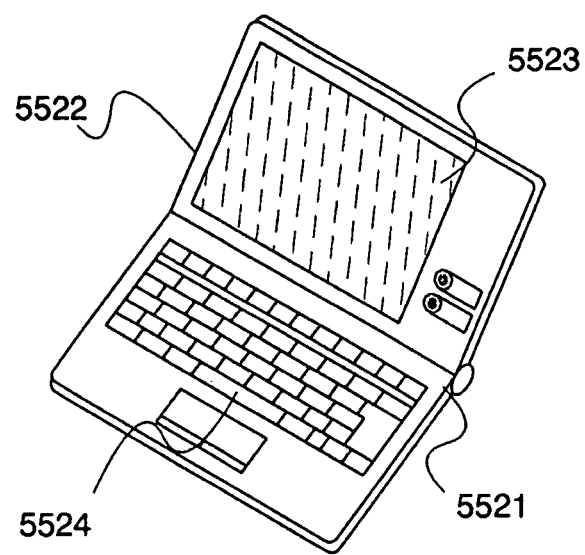
FIG. 9 is a view for showing an electric appliance applied with the present invention.

Such the memory device can be mounted, for example, to a computer illustrated in FIG. 9. FIG. 9 illustrates a lap top computer manufactured by applying the present invention. A main body 5521 of the lap top computer comprises a housing 5522, a display portion 5523, a key board 5524, and the like. The computer can be completed by incorporating the semiconductor device according to the present invention into the inside of the computer.

The invention claimed is:

1. A method for manufacturing a semiconductor device comprising the steps of:
   placing a substrate above a crucible in a treater, wherein the crucible contains a raw material;
   heating and sublimating the raw material to deposit an organic semiconductor over the substrate in the treater while introducing a first gas from below the crucible and the substrate;
   removing the substrate from the treater after depositing the organic semiconductor; and
   introducing a second gas into the treater and exhausting the second gas while heating the treater so that temperature in an inside of the treater is higher than a sublimation temperature of the organic semiconductor after removing the substrate from the treater,
   wherein the treater includes an outer tube and an inner tube,
   wherein the outer tube includes a curved top surface,
   wherein a top end portion of the inner tube is curved along the curved top surface of the outer tube, and
   wherein the inner tube has an opening at a top portion thereof to flow the first gas and the second gas between the outer tube and the inner tube.

2. The method for manufacturing a semiconductor device according to claim 1, wherein the first gas and the second gas are same.

3. The method for manufacturing a semiconductor device according to claim 1, wherein the organic semiconductor is pentacene.

4. A method for manufacturing a semiconductor device comprising the steps of:
   forming a gate electrode over a substrate;
   forming a gate insulating layer over the gate electrode;
   forming a source electrode and a drain electrode over the gate insulating layer;
   placing the substrate above a crucible in a treater, wherein the crucible contains a raw material;
   heating and sublimating the raw material to deposit an organic semiconductor while introducing a first gas from below the crucible and the substrate to form an active layer over the gate insulating layer and the source electrode and the drain electrode to be overlapped with the gate electrode;
   removing the substrate from the treater after depositing the organic semiconductor; and
   introducing a second gas into the treater and exhausting the second gas while heating the treater so that temperature in an inside of the treater is higher than a sublimation temperature of the organic semiconductor after removing the substrate from the treater,
   wherein the treater includes an outer tube and an inner tube,
   wherein the outer tube includes a curved top surface, and
   wherein a top end portion of the inner tube is curved along the curved top surface of the outer tube, and
   wherein the inner tube has an opening at a top portion thereof to flow the first gas and the second gas between the outer tube and the inner tube.

5. The method for manufacturing a semiconductor device according to claim 1, further comprising a step of collecting the organic semiconductor in the second gas after exhausting the second gas.

6. The method for manufacturing a semiconductor device according to claim 1, wherein the treater is set to a pressure from 0.1 to 50 torr during depositing the organic semiconductor.

7. The method for manufacturing a semiconductor device according to claim 1, wherein the second gas comprises at least one of a nitrogen gas and a rare gas.

8. A method for manufacturing a semiconductor device comprising the steps of:
   forming a gate electrode over a substrate;
   forming a gate insulating layer over the gate electrode;
   placing the substrate above a crucible in a treater, wherein the crucible contains a raw material;
   heating and sublimating the raw material to deposit an organic semiconductor while introducing a first gas from below the crucible and the substrate to form an active layer over the gate insulating layer;
   removing the substrate from the treater after depositing the organic semiconductor;
   introducing a second gas into the treater and exhausting the second gas while heating the treater so that temperature in an inside of the treater is higher than a sublimation temperature of the organic semiconductor after removing the substrate from the treater; and
   forming a source electrode and a drain electrode over the active layer,
   wherein the treater includes an outer tube and an inner tube,
   wherein the outer tube includes a curved top surface,
   wherein a top end portion of the inner tube is curved along the curved top surface of the outer tube, and
   wherein the inner tube has an opening at a top portion thereof to flow the first gas and the second gas between the outer tube and the inner tube.

9. The method for manufacturing a semiconductor device according to claim 8, wherein the first gas and the second gas are same.

10. The method for manufacturing a semiconductor device according to claim 8, wherein the organic semiconductor is pentacene.

11. The method for manufacturing a semiconductor device according to claim 8, further comprising a step of collecting the organic semiconductor in the second gas after exhausting the second gas.

12. The method for manufacturing a semiconductor device according to claim 8, wherein the treater is set to a pressure from 0.1 to 50 torr during depositing the organic semiconductor.

13. The method for manufacturing a semiconductor device according to claim 8, wherein the second gas comprises at least one of a nitrogen gas and a rare gas.

14. An electric appliance having a semiconductor device manufactured by the method for manufacturing a semiconductor device according to any one of claims 1, 8 and 4.

15. The method for manufacturing a semiconductor device according to claim 4, wherein the first gas and the second gas are same.

16. The method for manufacturing a semiconductor device according to claim 4, wherein the organic semiconductor is pentacene.

17. The method for manufacturing a semiconductor device according to claim 4, further comprising a step of collecting the organic semiconductor in the second gas after exhausting the second gas.

18. The method for manufacturing a semiconductor device according to claim 4, wherein the treater is set to a pressure from 0.1 to 50 torr during depositing the organic semiconductor.

19. The method for manufacturing a semiconductor device according to claim 4, wherein the second gas comprises at least one of a nitrogen gas and a rare gas.

* * * * *